United States Patent [19]

Hibino et al.

[11] Patent Number: 4,841,414

[45] Date of Patent: Jun. 20, 1989

[54] HIGH FREQUENCY APPARATUS CHASSIS AND CIRCUIT BOARD CONSTRUCTION

[75] Inventors: Eiichi Hibino; Kiyoshi Kawakita; Takami Yamamoto; Kazunori Kinoshita; Shigeki Takase, all of Nagaokakyo, Japan

[73] Assignee: Murata Manufacturing Co., Ltd., Japan

[21] Appl. No.: 267,658

[22] Filed: Nov. 3, 1988

Related U.S. Application Data

[63] Continuation of Ser. No. 145,644, Jan. 13, 1988, abandoned, which is a continuation of Ser. No. 937,223, Dec. 3, 1986, abandoned.

[30] Foreign Application Priority Data

Dec. 3, 1985 [JP] Japan ............................ 60-186442[U]

[51] Int. Cl.$^4$ .......................... H05K 5/04; H04B 1/08
[52] U.S. Cl. ..................................... 361/424; 361/399; 361/426; 334/85
[58] Field of Search ............... 361/395, 399, 417, 419, 361/420, 424, 426, 429; 334/85 X; 174/35 R; 439/68, 76, 607, 620

[56] References Cited

U.S. PATENT DOCUMENTS

| | | | |
|---|---|---|---|
| 3,816,911 | 6/1974 | Knappenberes | 361/424 |
| 4,063,788 | 12/1977 | Latasiewicz | 361/399 |
| 4,306,205 | 12/1981 | Ito | 334/85 |
| 4,325,103 | 4/1982 | Ito | 361/424 |
| 4,404,617 | 9/1983 | Ohyama | 334/85 |
| 4,494,095 | 1/1985 | Noji | 334/85 |

Primary Examiner—Gerald P. Tolin
Attorney, Agent, or Firm—Ostrolenk, Faber, Gerb & Soffen

[57] ABSTRACT

A construction for attaching terminals for a high frequency apparatus wherein a plurality of lead terminals are press-fitted in a terminal holder made of resin, and the terminal holder with the lead terminals inserted in apertures in a circuit board is clamped between the circuit board fixed to a chassis and a shield plate installed in the chassis.

17 Claims, 3 Drawing Sheets

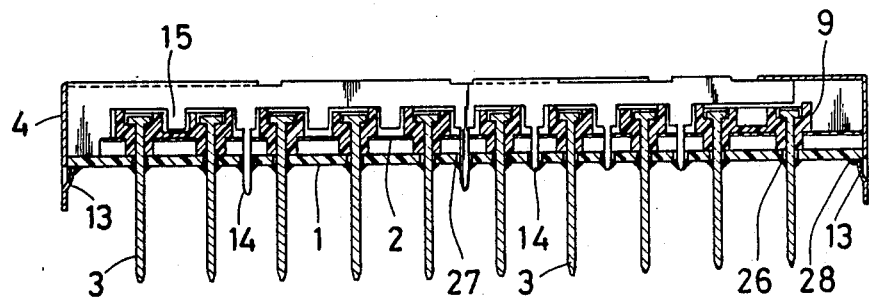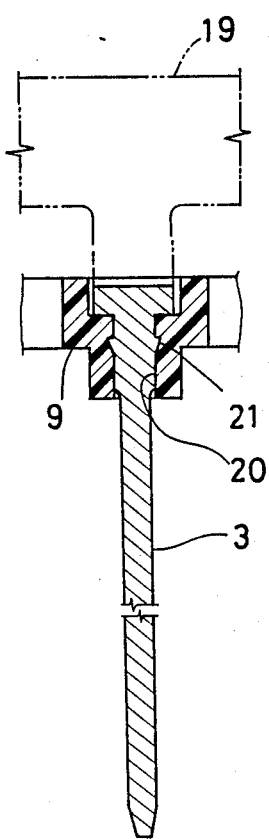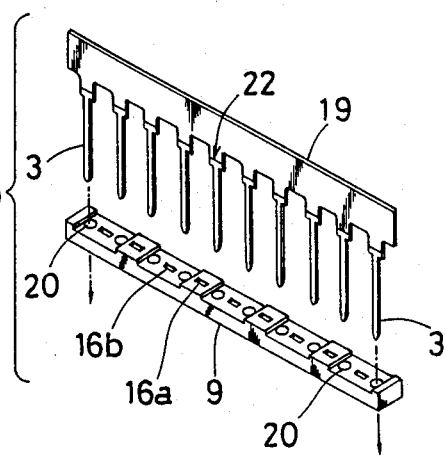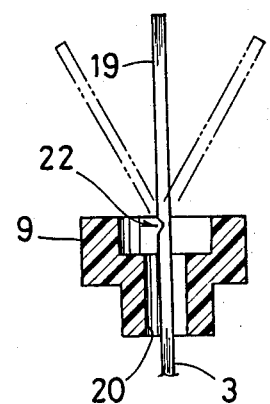

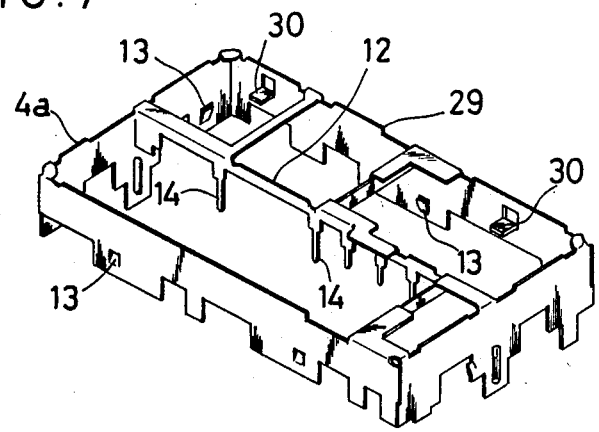
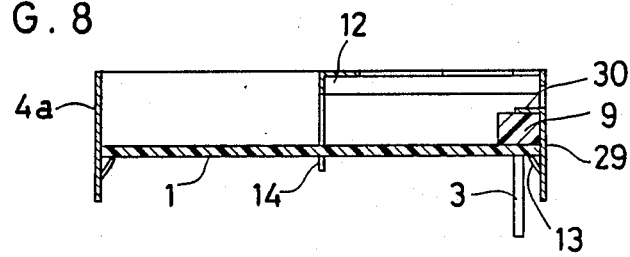
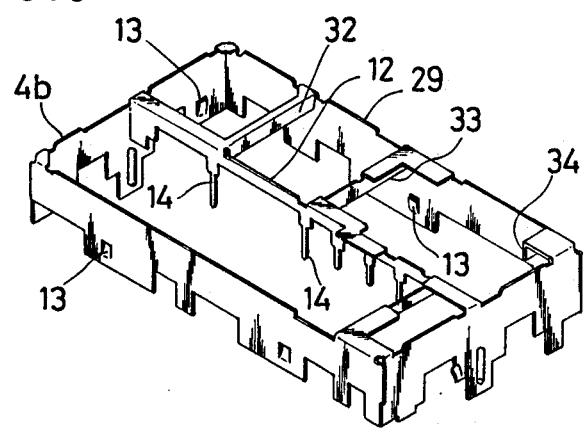

HIGH FREQUENCY APPARATUS CHASSIS AND CIRCUIT BOARD CONSTRUCTION

This is a continuation of application Ser. No. 145,644 filed on Jan. 13, 1988 now abandoned, which is a continuation of application Ser. No. 937,223 filed Dec. 3, 1986, and now abandoned.

BACKGROUND OF THE INVENTION

1. Field of the Invention

This invention relates to a high frequency apparatus, such as an electronic tuner, and particularly it relates to a construction for attaching input and output external connection lead terminals.

2. Description of the Prior Art

Heretofore, in a high frequency apparatus, such as an electronic tuner, external connection lead terminals have been fixed in position by being individually press-fitted in apertures formed in the circuit board provided in such apparatus.

Such construction, however, has the following disadvantages:

(1) In the case where the circuit board is made of a hard material, such as glass epoxy resin, the press fitting of lead terminals has been difficult.

(2) In the case where the circuit board is thin, the lead terminal retaining force so low that the lead terminals tend to tilt or even slip off.

(3) If other components are first installed, it becomes difficult to set the circuit board on a jig to be used in press-fitting the lead terminals and there is much possibility of the components previously installed being damaged during press fitting of lead terminals.

(4) Conversely, if lead terminals are first installed, they form obstacles which sometimes make it impossible to set the circuit board on a device for placing the chip components.

SUMMARY OF THE INVENTION

The present invention which has been accomplished in view of these circumstances, is intended to provide simple, reliable and accurate attachment of lead terminals while making it possible to first attach other components to a circuit board.

A high frequency apparatus according to this invention is characterized in that a plurality of external connection terminals are fixedly held by a terminal holder of resin or other insulation material. For example, a base plate, which may be a circuit board is fixed in position as it is received in a chassis. The chassis is fixedly provided with positioning means which is positioned to define a predetermined spacing between it and one main surface of the base plate. With the plurality of external connection lead terminals inserted respectively in the plurality of apertures formed in the base plate, the terminal holder is positioned by being clamped between the base plate and the positioning means.

According to this invention, since the plurality of external connection lead terminals are not only supported by the base plate but also pre-supported by the terminal holder, the plurality of lead terminals can be easily and accurately attached to the base plate regardless of the material and thickness of the base plate. Further, since the terminal holder is clamped by the base plate and the positioning means of the chassis, the lead terminals can be attached to the base plate in the correct position and without the danger of slipping off even if the base plate is thin. Further, the plurality of lead terminals can be integrally handled through the intermediary of the terminal holder; therefore, when the base plate serves as the circuit board, even if chip components are first mounted on the circuit board, the lead terminals can be easily attached. Therefore, there is no restriction on the order of attachment of the components to be attached to the circuit board, and it is possible to optionally select any order of attachment which provides high productivity. Further, the plurality of lead terminals held by the terminal holder are handled through the intermediary of the terminal holder, making it possible to apply substantially the same mounting method to the lead terminals as that for other electronic components. Further, since the terminal holder can be substantially fixed in position simply by being clamped between the base plate and the positioning means, it is possible to increase the efficiency of operation for attaching the plurality of lead terminals.

In a preferred embodiment, the aforesaid positioning means is provided by a shield plate integral with the chassis or by cut-out tabs formed on at least one surface of the chassis.

BRIEF DESCRIPTION OF THE DRAWINGS

FIG. 3 is a side view, in longitudinal cross section, of the high frequency apparatus of FIG. 1, shown in its assembly-completed state;

FIG. 4 is an enlarged view of one of the lead terminals in FIG. 1, showing how it is held in a terminal holder 9;

FIG. 5 is a perspective view for explaining a preferred method of combining a plurality of lead terminals 3 with the terminal holder 9;

FIG. 6 is a view for explaining the step of separating the lead terminals 3 from a support 19;

FIG. 7 is a perspective view of a chassis 4a used in another embodiment of the invention;

FIG. 8 is an end view, in transverse cross section, showing the lead terminals 3 fixed in position by using the chassis 4a shown in FIG. 7; and FIG. 9 is a perspective view of a chassis 4b used in another embodiment of the invention.

DESCRIPTION OF THE PREFERRED EMBODIMENTS

Figure 1:
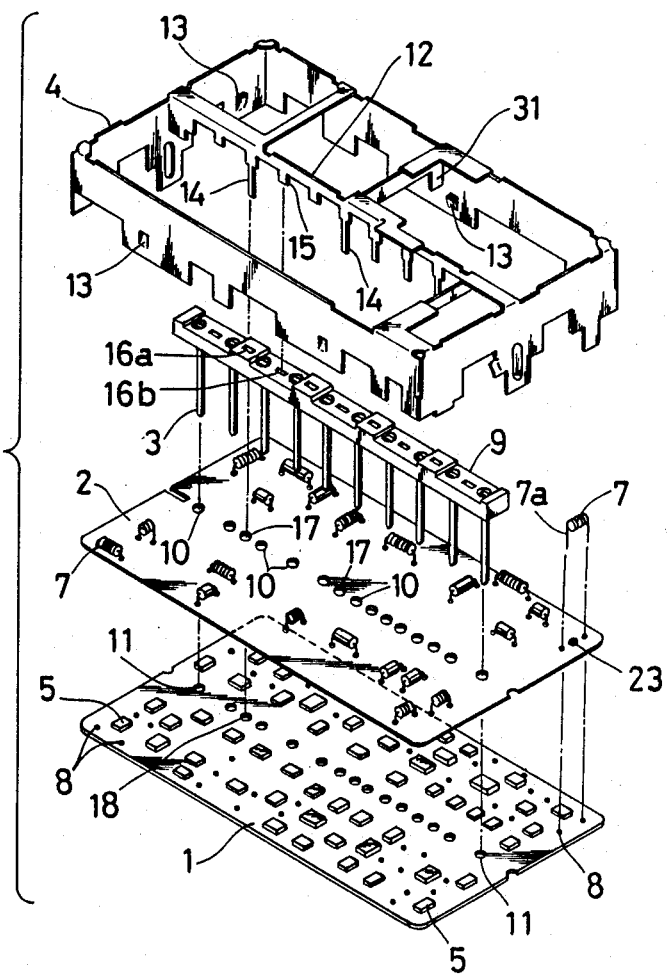
FIG. 1 is an exploded perspective view showing components of a high frequency apparatus according to an embodiment of the invention.

In FIG. 1, a miniature type electronic tuner, which is an example of a high frequency apparatus, is shown. In FIG. 1, the numeral 1 denotes a circuit board serving as a base plate; 3 denotes external connection lead terminals; and 4 denotes a chassis.

Printed circuit board patterns (not shown) are formed on the upper and lower surfaces of the circuit board 1. A plurality of chip components 5 are installed on the upper surface of the circuit board 1 by using solder paste. It is arranged that the chip components 5 are fixed on the upper surface of the circuit board 1 by the solder paste by being passed through a furnace for undergoing a solder melting treatment. Chip components 6 (see FIG. 2) are temporarily fixed for mounting on the lower surface of the circuit board 1 by an adhesive agent.

The insulation film 2 is in the form of a thin film of polyimide or other heat resistant material which is about 0.1 mm thick. The insulation film 2 is exactly or approximately the same in size as the circuit board 1. A plurality of lead-ended components 7, such as coils and diodes, are temporarily fixed for mounting on the upper surface of the insulation film 2 by an adhesive agent 23, lead wires 7a of said components 7 extending downward through the insulation film 2. The adhesive agent 23 for temporarily fixing the lead-ended components 7 is applied to predetermined positions on the insulation film 2 by screen printing. The insulation film 2 with the lead-ended components 7 mounted thereon is placed on the chip components 5 on the circuit board 1, with the lead wires 7a inserted in apertures 8 formed in the circuit board 1.

The lead terminals 3 are press-fitted in a terminal holder 9 of resin in a row with a predetermined pitch. The lead terminals 3 are inserted in a central row of apertures 11 in the circuit board 1 via a central row of apertures 10 in the insulation film 2.

The chassis 4 is formed into a rectangular frame by bending a single metal sheet blank punched out from the die and has four lateral surfaces. The chassis 4 is formed with a shield plate 12 extending between the upper edges of its opposed peripheral walls. The circuit board 1 having said insulation film 2 and lead terminals 3 attached thereto is inserted into the chassis 4 from below. In this inserted state, the circuit board 1 is positioned and fixed in the chassis 4 with respect to the vertical dimension by a portion of the lower end of the vertically extending region of the shield plate 12 and by tabs 13 cut out from, and extending inwardly of, the peripheral walls (hereinafter "cut-out tabs"). The terminal holder 9 is clamped between the circuit board 1 and the lower edge of the centrally extending portion of the shield plate 12. The central portion of the shield plate 12 is formed with a plurality of relatively long guide projections 14 and a plurality of relatively short guide projections 15, said projections 14 and 15 extending downward. The terminal holder 9 is formed with apertures 16a and 16b for receiving said guide projections 14 and 15. The long guide projections 14 extending through the lead holder 9 are inserted into the apertures 18 in the circuit board 1 via the apertures 17 in the insulation film 2. In this state, the lead terminals 3, the central portion of the shield plate 12, and the guide projections 14 and 15 are positioned in substantially the same plane.

Figure 2:
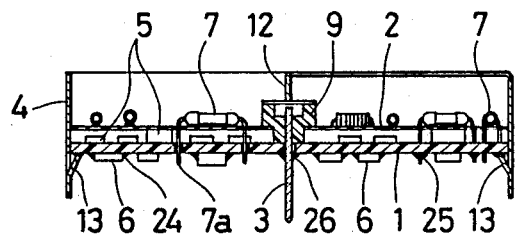
FIG. 2 is an end view, in transverse cross section, of the high frequency apparatus of FIG. 1, shown in its assembly-completed state.

The positional relationship of the components resulting from the above assembly operation is shown in FIGS. 2 and 3. It is to be pointed out that in FIGS. 2 and 3, some of the electronic components are omitted from the illustration and the shape of the chassis 4 is shown simplified. In this assembled state, a solder dip treatment is performed from the lower surface of the circuit board 1 to solder the lower chip components 6, lead wires 7a, lead terminals 3 and long guide projections 14 simultaneously to the printed circuit pattern. In FIGS. 2 and 3, the numerals 24, 25, 26, 27 and 28 indicate masses of solder.

FIGS. 4 through 6 show an example of a procedure for attaching the lead terminals 3 to the terminal holder 9. The lead terminals 3, as shown in FIG. 5, are constructed originally integral with a support portion 19 in which they are arranged in a row, and the whole is brought into engagement with the terminal holder 9 until the lead terminals 3 are press-fitted in the row of apertures 20 to the fullest degree. Each lead terminal 3 has a slip-out preventing projection 21 adjacent the base thereof adapted to cut into the terminal holder 9, as shown in FIG. 4, whereby the lead terminals 3 are prevented from slipping out once they are press-fitted. After all the lead terminals 3 have been press-fitted in this manner, as shown in FIG. 6, the support portion 19 is broken off by repeatedly bending it along notches 22 precut in the lead terminals 3 adjacent their upper ends.

The terminal holder 9 is injection molded of a heat resistant resin, such as polybutylene terephthalate, so as not to be adversely affected during the solder dip process.

To fixedly retain the lead terminals 3 in the terminal holder 9, it is possible, as an alternative to using said press-fitting, to insert the lead terminals 3 in the metal mold when the terminal holder 3 is molded. This also provides substantially the same construction as the one shown in FIG. 4. In the case where such an insert mold is used, the presence of the projections 21 is also advantageous in that they prevent the lead terminals 3 from slipping out after the molding of the terminal holder 9.

Referring to FIG. 7, a chassis 4a to be used in another embodiment according to the invention is shown. This chassis 4a differs from the chassis 4 shown in FIG. 4 in the following respects. First, one side wall 29 of the chassis 4a is provided with, for example, two cut-out tabs 30 which project inward above the cut-out tabs 13. Second, the relatively short guide projections 15 that were provided on the shield plate 12 in the chassis 4 in FIG. 1 are removed. Finally, the projections 31 extending from part of the shield plate 12 in FIG. 1 are also removed. The rest of the arrangement is substantially the same as in the chassis 4; thus, the corresponding parts are indicated by the corresponding reference characters to avoid a repetition of the same description.

According to the chassis 4a shown in FIG. 7, the terminal holder 9 holding the lead terminals 3 can be disposed to extend along the side wall 29. That is, the terminal holder 9 is positioned by being clamped between the circuit board 1 and the cut-out tabs 30. Owing to the elasticity of the metal plate, the cut-out tabs 30 exert elastic forces directed to the circuit board 1 to act on the terminal holder 9, so that the latter is firmly positioned. FIG. 8 is intended chiefly to show the positioned relationship between the cut-out tabs 30 and the circuit board 1, the illustration of many other components included in the electronic tuner being omitted or simplified.

In addition, cut-out tabs corresponding to those shown at 30 in FIG. 7 may also be provided on other side walls adjacent to the side wall 29.

FIG. 9 shows a chassis 4b to be used in another embodiment of the invention. This chassis 4b, like the chassis 4a shown in FIG. 7, is designed to arrange the terminal holder 9 along the side wall 29. To this end, the portions of the shield plate 12 which are at right angles to the side wall 29 are formed with depending walls 32, 33 and 34 serving as positioning means for the terminal holder 9. In this chassis 4b also, the guide projections 15 in the chassis 4 and the projections 31 shown in FIG. 1 are removed. The rest of the arrangement of the chassis 4b is substantially the same as in the chassis 4 or 4a described previously; thus, the corresponding parts are indicated by the corresponding reference characters to avoid a repetition of the same description.

Although the present invention has been described and illustrated in detail with respect to embodiments thereof, it is clearly understood that the same is by way of illustration and example only and is not to be taken by way of limitation, the scope of the present invention being limited only by the terms of the appended claims.

What is claimed is:

1. A high frequency apparatus construction comprising:
    a printed circuit base plate having first and second main surfaces opposed to each other, and a plurality of first apertures extending therethrough at right angles to said first and second main surfaces; said base plate including a circuit pattern on at least said second main surface;
    a chassis which defines a top surface plane, said chassis receiving said base plate;
    fixing means fixing said base plate in said chassis;
    positioning means fixedly provided on said chassis and defining a predetermined spacing between said top surface plane of said chassis and the first main surface of said base plate;
    a plurality of external connection lead terminals inserted in said plurality of first apertures to extend away from said top surface plane and below said base plate; and soldered to said circuit pattern; and
    a terminal holder made of insulation material and fixedly retaining said plurality of external connection lead terminals, said terminal holder being positioned by being clamped between said first main surface of said base plate and said positioning means; wherein said chassis is formed from a single metal plate which is punched and shaped in such a manner that it has four side walls depending at right angles to said top surface plane and said first and second main surfaces of said base plate and successively connected together, said chassis having a shield plate thereon and defining said top surface plane, and said positioning means is formed at least in part by a depending portion of said shield plate; and
    wherein said depending portion of said shield plate extends at right angles to said first main surface of said base plate and has a predetermined length, and said positioning means is formed by at least a portion of the depending portion of said shield plate opposed to said first main surface for spacing said base plate from said top surface plane at least by said predetermined length.

2. A high frequency apparatus construction as set forth in claim 1, wherein said chassis and said shield plate are integral with each other.

3. A high frequency apparatus construction as set forth in claim 1, wherein said shield plate is formed with guide projections extending from said depending portion at positions where they do not interfere with said plurality of external connection lead terminals, and wherein said base plate is formed with second and third apertures receiving said guide projections, the latter being soldered to said circuit pattern on said second main surface of said base plate.

4. A high frequency apparatus construction as set forth in claim 3, wherein said plurality of external connection lead terminals, said depending portion of said shield plate, and said guide projections are positioned in substantially the same plane and engage respective portions of said terminal holder.

5. A high frequency apparatus construction as set forth in claim 1, wherein said chassis is formed of a metal plate which is punched and shaped to define a top surface plane and four side walls depending from said top surface plane at right angles to said first and second main surfaces of said base plate, at least one of said side walls being formed with cut-out tabs which partially form said positioning means.

6. A high frequency apparatus construction as set forth in claim 5, wherein said terminal holder is positioned on said base plate along the side wall which is formed with said cut-out tabs.

7. A high frequency apparatus construction as set forth in claim 6, wherein said cut-out tabs engage said terminal holder and exert elastic forces directed toward said first main surface on said terminal holder.

8. A high frequency apparatus construction as set forth in claim 1, wherein said terminal holder is made of resin material.

9. A high frequency apparatus construction as set forth in claim 8, wherein said terminal holder has apertures receiving said external connection lead terminals, and said external connection lead terminals are press-fitted in said apertures and are thereby fixed to said terminal holder.

10. A high frequency apparatus construction as set forth in claim 8, wherein said terminal holder is molded around said external connection lead terminals inserted therein.

11. A high frequency apparatus construction as set forth in claim 1, wherein said fixing means comprises engaging tabs on said chassis engaging said second main surface of said base plate.

12. A high frequency apparatus construction as set forth in claim 11, wherein said base plate and said terminal holder are clamped between said positioning means and said engaging tabs.

13. A high frequency apparatus construction as set forth in claim 12, wherein said chassis is made of metal, and said chassis is soldered to said circuit pattern of said base plate.

14. A high-frequency apparatus construction as set forth in claim 1, wherein the chassis further defines a bottom surface plane opposed to the top surface plane, and the external connection lead terminals extend below the bottom surface plane of the chassis.

15. A high frequency apparatus construction comprising:
    a printed circuit base plate having first and second main surfaces opposed to each other, and a plurality of first apertures extending therethrough at right angles to said first and second main surfaces; said base plate including circuit pattern on at least said second main surface;
    a chassis which defines a top surface plane, said chassis receiving said base plate;
    fixing means fixing said base plate in said chassis;
    positioning means fixedly provided on said chassis and defining a predetermined spacing between said top surface plane of said chassis and the first main surface of said base plate;
    a plurality of external connection lead terminals inserted in said plurality of first apertures to extend away from said top surface plane and below said base plate; and soldered to said circuit pattern; and
    a terminal holder made of insulation material and fixedly retaining said plurality of external connection lead terminals, said terminal holder being positioned by being clamped between said first main surface of said base plate and said positioning means;

wherein said chassis is formed from a single metal plate which is punched and shaped in such a manner that it has four side walls depending at right angles to said top surface plane and said first and second main surfaces of said base plate and successively connected together, said chassis having a shield plate thereon and defining said top surface plane, and said positioning means is formed at least in part by a depending portion of said shield plate;

wherein said depending portion of said shield plate extends at right angles to said first main surface of said base plate and has a predetermined length, and said positioning means is formed by at least a portion of the depending portion of said shield plate opposed to said first main surface for spacing said base plate from said top surface plane at least by said predetermined length;

wherein said shield plate is formed with guide projections extending from said depending portion at positions where they do not interfere with said plurality of external connection lead terminals, and wherein said base plate is formed with second and third apertures receiving said guide projections, the latter being soldered to said circuit pattern on said second main surface of said base plate; and wherein said plurality of external connection lead terminals, said depending portion of said shield plate, and said guide projections are positioned in substantially the same plane and engage respective portions of said terminal holder.

16. A high frequency apparatus construction as set forth in claim 15, wherein said shield plate is formed integrally with said chassis.

17. A high-frequency apparatus construction as set forth in claim 15, wherein the chassis further defines a bottom surface plane opposed to the top surface plane, and the external connection lead terminals extend below the bottom surface plane of the chassis.

* * * * *